United States Patent
Lin et al.

(10) Patent No.: US 7,608,522 B2
(45) Date of Patent: Oct. 27, 2009

(54) METHOD FOR FABRICATING A HYBRID ORIENTATION SUBSTRATE

(75) Inventors: Chien-Ting Lin, Hsin-Chu (TW); Che-Hua Hsu, Hsin-Chu Hsien (TW); Yao-Tsung Huang, Kaoshiung County (TW); Guang-Hwa Ma, Hsinchu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/684,634

(22) Filed: Mar. 11, 2007

(65) Prior Publication Data

US 2008/0220595 A1 Sep. 11, 2008

(51) Int. Cl.
*H01L 21/30* (2006.01)
(52) U.S. Cl. .............. 438/455; 438/198; 438/275; 438/486
(58) Field of Classification Search .......... 438/486, 438/199, 275, 455, 788, 791, 792, 187, 198, 438/973, FOR. 407; 117/9, 10; 257/E21.133, 257/E21.12
See application file for complete search history.

(56) References Cited

U.S. PATENT DOCUMENTS

| | | | |
|---|---|---|---|
| 6,972,478 B1 | 12/2005 | Waite et al. | |
| 7,023,055 B2 | 4/2006 | Ieong et al. | |
| 2005/0116290 A1 | 6/2005 | de Souza et al. | |
| 2006/0154429 A1 | 7/2006 | de Souza et al. | |
| 2006/0223290 A1* | 10/2006 | Belyansky et al. | 438/520 |
| 2007/0215984 A1* | 9/2007 | Shaheen et al. | 257/618 |
| 2007/0246781 A1* | 10/2007 | Tsuchiaki | 257/369 |

OTHER PUBLICATIONS

Chun-Yung Sung, et al., "High Performance CMOS Bulk Technology Using Direct Silicon Bond (DSB) Mixed Crystal Orientation Substrates", IEEE, 2005, USA.

* cited by examiner

*Primary Examiner*—Julio J. Maldonado
(74) *Attorney, Agent, or Firm*—Winston Hsu

(57) ABSTRACT

A method for fabricating a hybrid orientation substrate includes steps of providing a direct silicon bonding (DSB) wafer having a first substrate with (100) crystalline orientation and a second substrate with (110) crystalline orientation directly bonded on the first substrate, forming and patterning a first blocking layer on the second substrate to define a first region not covered by the first blocking layer and a second region covered by the first blocking layer, performing an amorphization process to transform the first region of the second substrate into an amorphized region, and performing an annealing process to recrystallize the amorphized region into the orientation of the first substrate and to make the second region stressed by the first blocking layer.

10 Claims, 21 Drawing Sheets

METHOD FOR FABRICATING A HYBRID ORIENTATION SUBSTRATE

BACKGROUND OF THE INVENTION

1. Field of the Invention

The present invention relates to a method for fabricating a hybrid orientation substrate, and more particularly, to a method for fabricating a hybrid orientation substrate with solid phase epitaxy (SPE) technique.

2. Description of the Prior Art

Semiconductor device technology is increasingly relying on specialty Si-based substrates to improve the performance of complementary metal oxide semiconductor (CMOS) devices. For example, to fully take advantage of the silicon orientation dependence of carrier mobility, NMOS and PMOS transistors are respectively fabricated on (100)-Si substrate in which electron mobility is higher and on (110)-Si substrate in which hole mobility is higher. Such strong dependence of carrier mobility on silicon orientation has led to increased interest in the hybrid orientation substrate.

In prior art, the hybrid orientation substrate was achieved on direct silicon bonding (DSB) mixed orientation substrates using solid phase epitaxy (SPE). Please refer to FIGS. 1-5, which are schematic drawings illustrating a conventional method for fabricating a hybrid orientation substrate. As shown in FIG. 1, a (100)-oriented Si substrate 100 is provided and a (110)-oriented Si substrate 102 is directly bonded to the (100)-oriented Si substrate 100 by DSB technique without interfacial oxide formed in between. And a photoresist 104 is formed on the (110)-oriented Si substrate 102 to define an NMOS region 110 and a PMOS region 112.

Please refer to FIGS. 2-4. Then, a SPE method is used to convert the orientation of NMOS region 110 from (110)-oriented into (100)-oriented. As shown in FIG. 2, the NMOS region 110 is exposed to an amorphizing ion implantation 120 and is amorphized to a depth beyond the bonded interface between the (100)-oriented Si substrate 100 and the (110)-oriented Si substrate 102, thus an amorphized region 122 is formed.

Please refer to FIGS. 3 and 4. The amorphized region 122 is then recrystallized into the bottom crystal orientation. By using the (100)-oriented Si substrate 100 as a template, a (100)-oriented epitaxial region 124 is formed, and thus a hybrid orientation Si substrate is obtained. The interface region 130 between the (100)-oriented epitaxial region 124 and the (110)-oriented Si substrate is removed to form a shallow trench isolation (STI) 140 for providing an electrical isolation between the NMOS region 110 and the PMOS region 112 as shown in FIG. 5.

Please refer to FIG. 3 again. It is noteworthy that the (100)-oriented epitaxial region 124 is recrystallized along both surfaces of the (100)-oriented Si substrate 100 and the (110)-oriented Si substrate 102, respectively with the (100) and (110) crystalline orientations as the arrows shown in FIG. 3. Therefore the interface region 130 between the (100)-oriented epitaxial region 124 and the (110)-oriented Si substrate 102 is slanted as shown in FIG. 4. It is easily realized that the more slanted interface causes the bigger interface region 130. Since the slanted interface region 130 is entirely removed to form the STI 140, the bigger interface region 130 results the bigger STI 140 which consumes valuable space on a semiconductor wafer and reduces the integration of the semiconductor wafer.

SUMMARY OF THE INVENTION

Therefore the present invention provides a method for fabricating a hybrid orientation substrate capable of reducing lateral morphology extension in the hybrid orientation substrate.

According to the claimed invention, a method for fabricating a hybrid orientation substrate is provided. The method comprises steps of providing a direct silicon bonding (DSB) wafer having a first substrate with (100) crystalline orientation and a second substrate with (110) crystalline orientation formed on the first substrate, forming and patterning a first blocking layer on the second substrate to define a first region not covered by the first blocking layer and a second region covered by the first blocking layer, performing an amorphization process to transform the first region of the second substrate into an amorphized region, and performing an annealing process to recrystallize the amorphized region into the orientation of the first substrate and to make the second region stressed by the first blocking layer.

According to the claimed invention, another method for fabricating a hybrid orientation substrate is provided. The method comprises providing a direct silicon bonding (DSB) wafer having a first substrate with (100) crystalline orientation and a second substrate with (110) crystalline orientation formed thereon, forming and patterning a first blocking layer on the second substrate to define a first region not covered by the first blocking layer and a second region covered by the first blocking layer, performing an amorphization process to transform the first region and the second region respectively into a first amorphized region and a second amorphized region, and performing an annealing process to recrystallize the first amorphized region and the second amorphized region respectively into the orientations of the first substrate and the second substrate.

According to the claimed invention, another method for fabricating a hybrid orientation substrate is provided. The method comprises providing a direct silicon bonding (DSB) wafer having a first substrate with (100) crystalline orientation and a second substrate with (110) crystalline orientation formed thereon, performing a first amorphization process to partially transform the second substrate into a first amorphized region, forming a patterned first blocking layer on the second substrate to define a first region not covered by the first blocking layer and a second region covered by the first blocking layer, performing a second amorphization process to transform the first region into an second amorphized region, and performing an annealing process to recrystallize the first amorphized region into the orientation of the second substrate and the second amorphized region into the orientation of the first substrate.

According to the claimed invention, still another method for fabricating a hybrid orientation substrate is provided. The method comprises providing a direct silicon bonding (DSB) wafer having a first substrate with a first crystalline orientation and a second substrate with a second crystalline orientation formed thereon, forming and patterning a blocking layer on the second substrate to define a first region not covered by the blocking layer and a second region covered by the blocking layer, performing an ion implantation process to implant a dopant into the first region of the second wafer to form an amorphized region, and performing an annealing process to recrystallize the amorphized region into the orientation of the first substrate.

Accordingly, the lateral morphology extension in the hybrid orientation substrate is reduced so that the interface region between the first substrate and the second substrate is correspondingly reduced and thus space for forming the STI is economized. Furthermore, a provided stress layer in the present invention further improves a speed of the MOS transistors and recrystallization quality.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
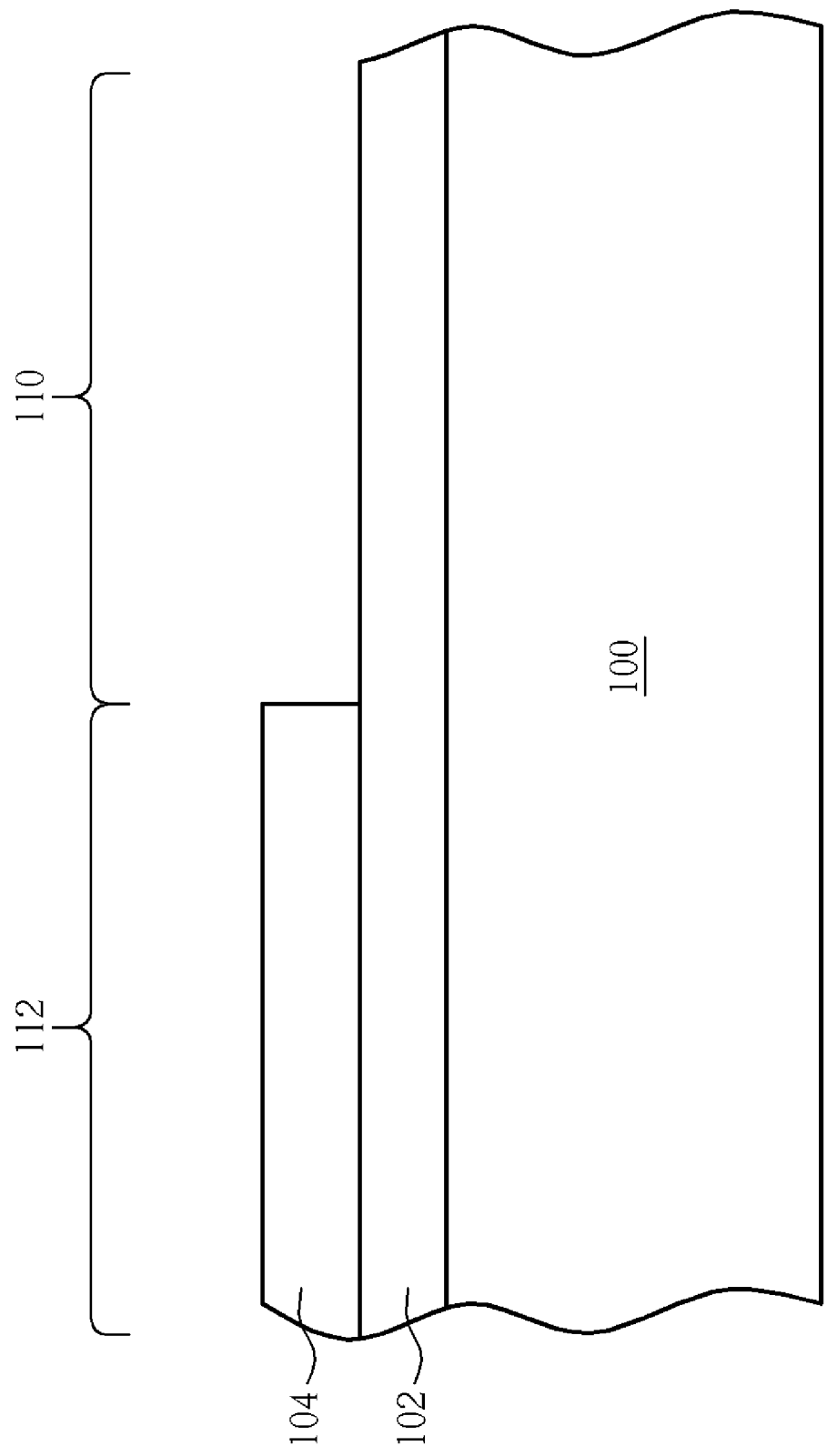
FIGS. 1-5 are schematic drawings illustrating a conventional method for fabricating a hybrid orientation substrate.
Figure 2:
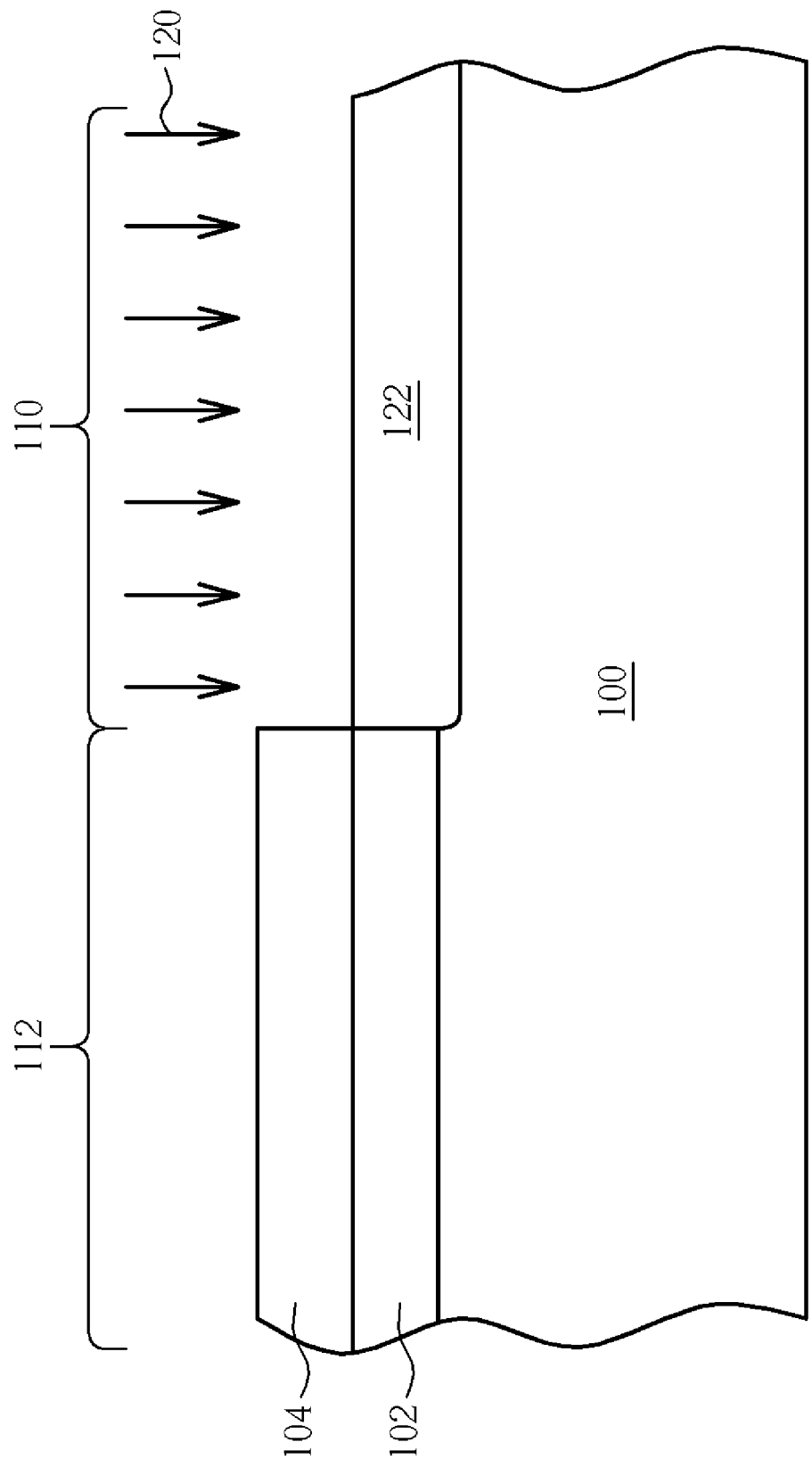
Figure 3:
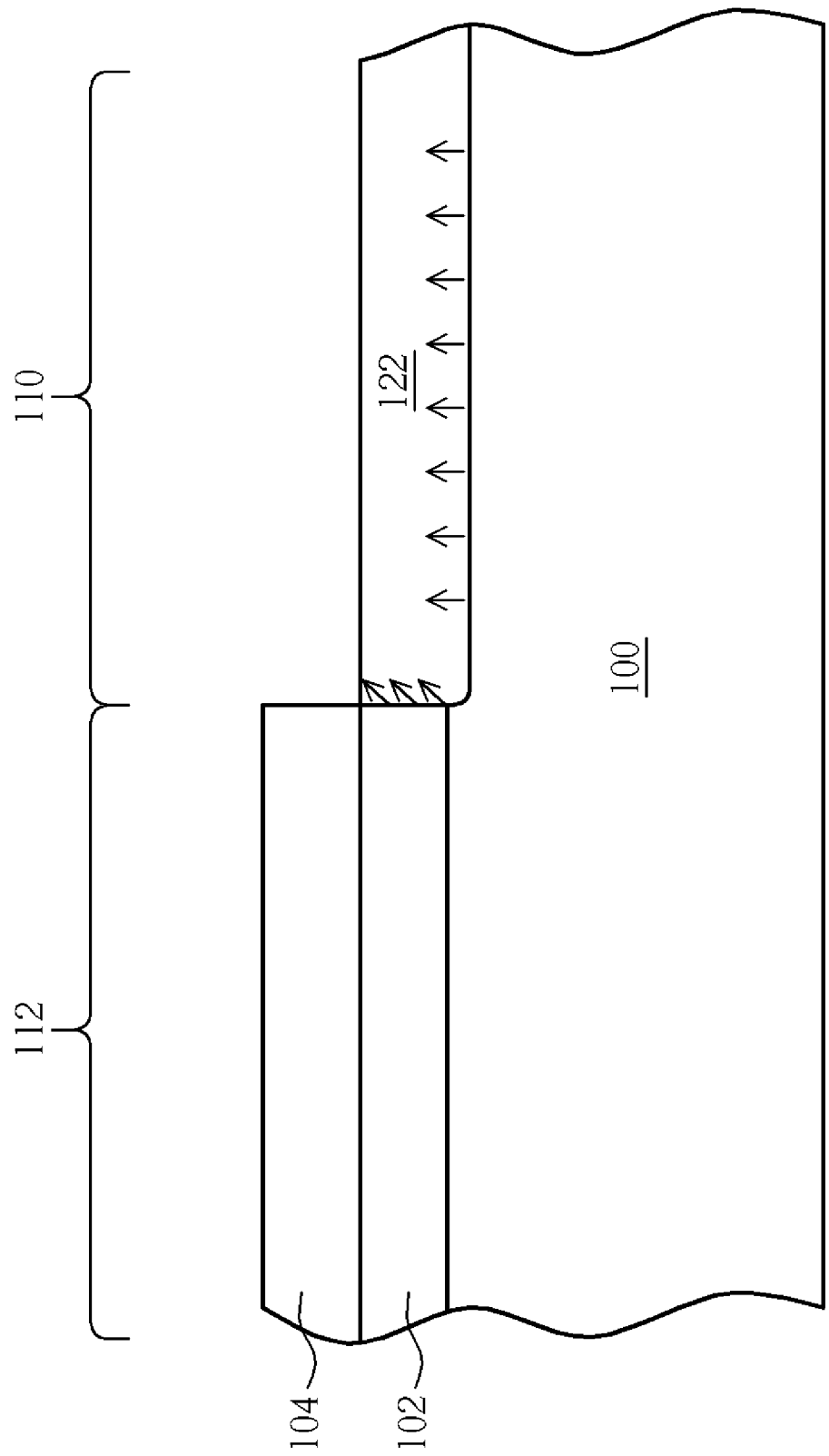
Figure 4:
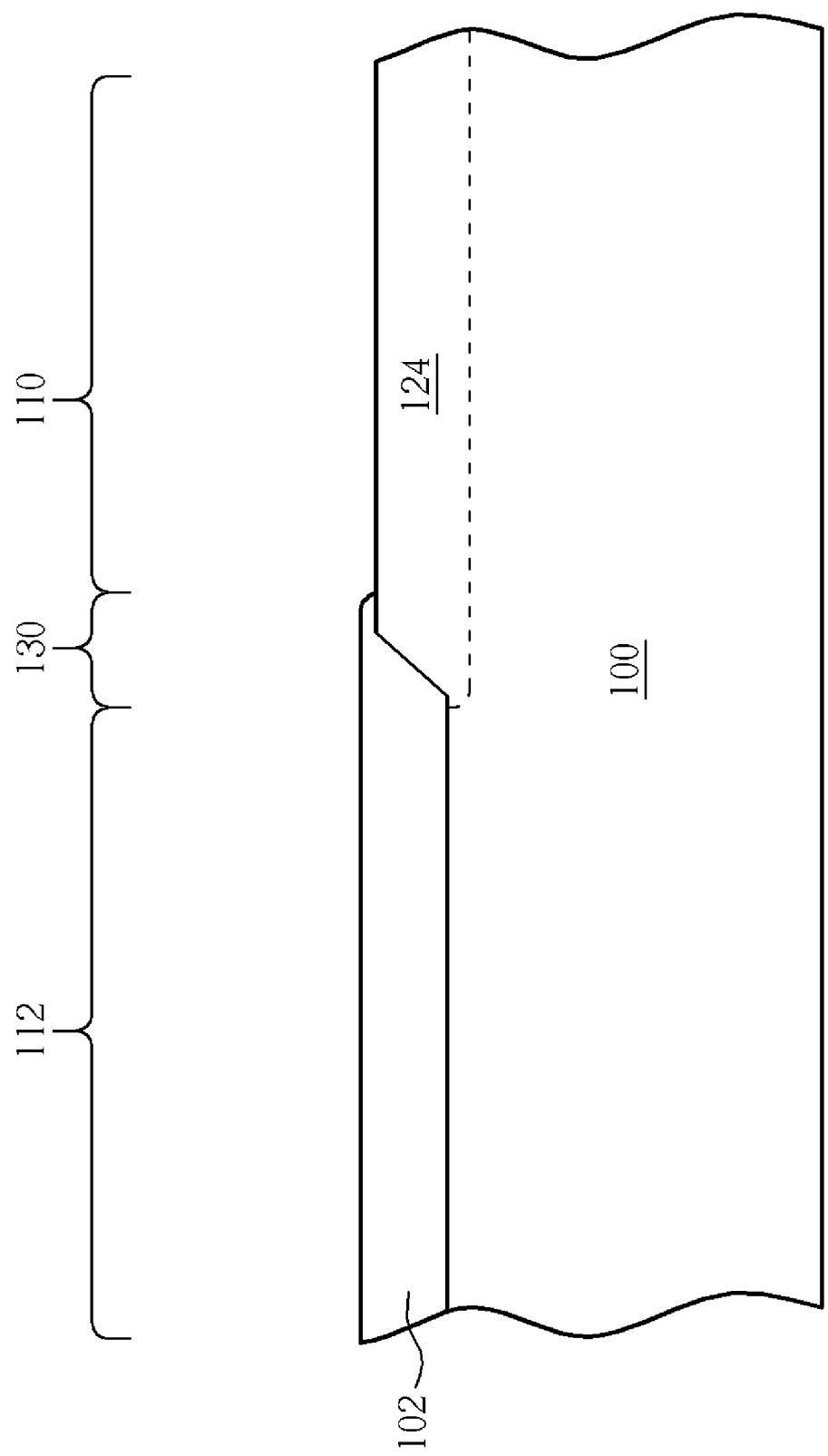
Figure 5:
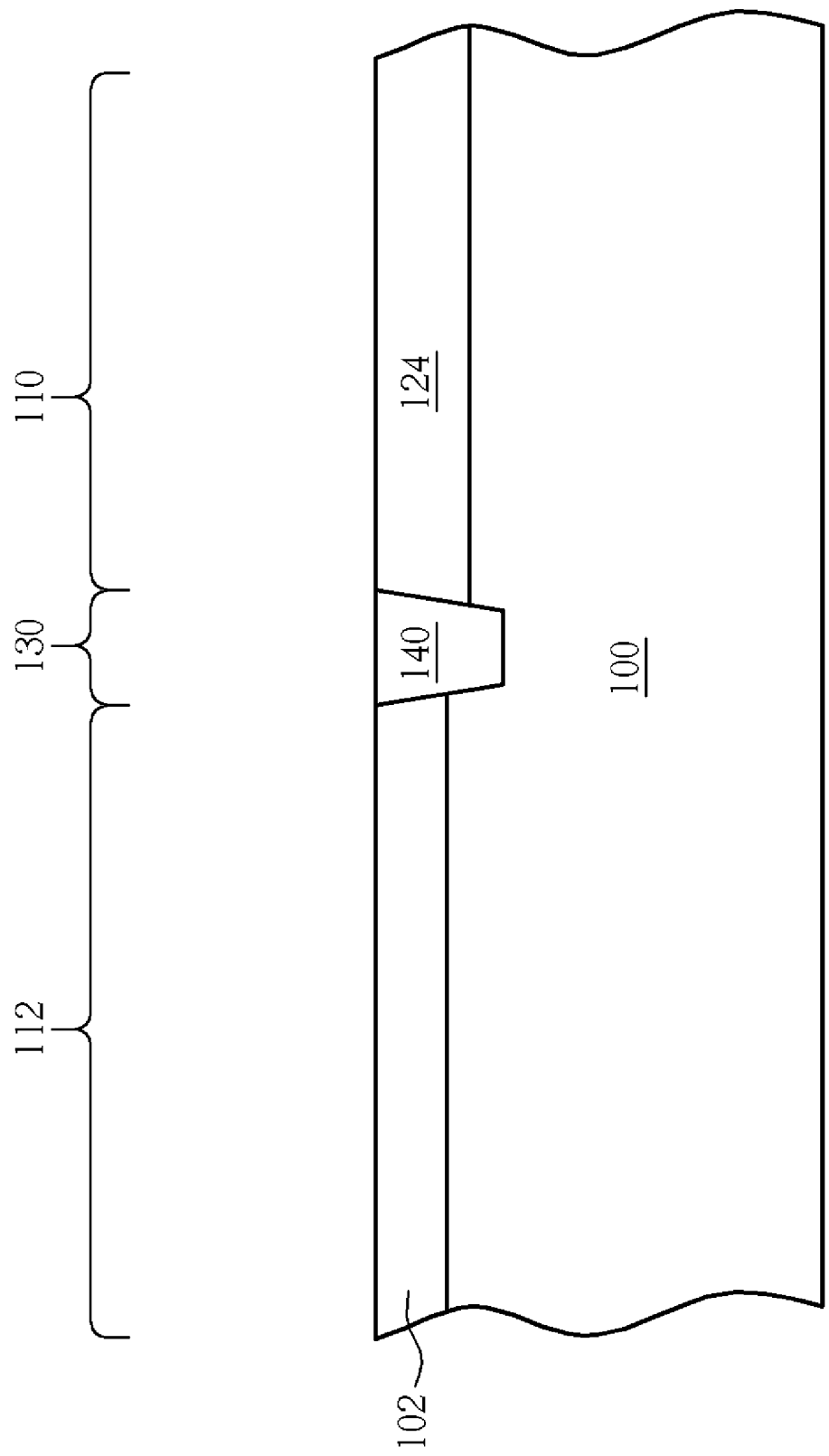
Figure 6:
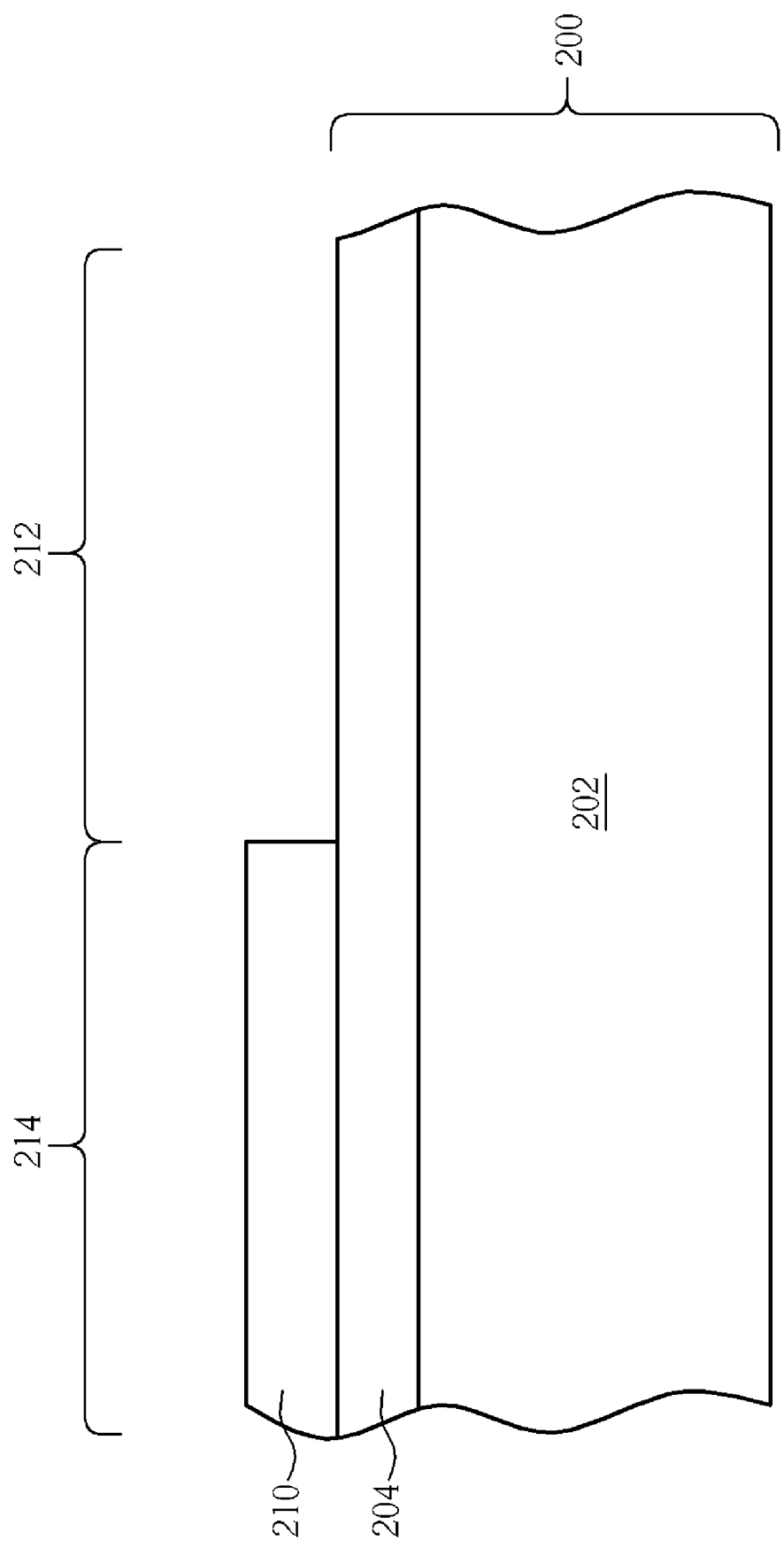
FIGS. 6-10 are schematic drawings illustrating a first preferred embodiment of the method for fabricating a hybrid orientation substrate.

Please refer to FIGS. 6-10, which are schematic drawings illustrating a first preferred embodiment of the method for fabricating a hybrid orientation substrate. As shown in FIG. 6, a direct silicon bonding (DSB) wafer 200 having a first substrate 202 with a first crystalline orientation and a second substrate 204 with a second crystalline orientation directly bonded on the first substrate 202 is firstly provided. In the first preferred embodiment, the first crystalline orientation is (100) and the second crystalline orientation is (110). However, it is not limited that the first crystalline orientation can be (110) or other crystalline orientations while the second crystalline orientation is (100) or other crystalline orientations. Then, a first blocking layer 210 comprising silicon oxide, silicon nitride, or silicon oxynitride is formed on the second substrate 204. The first blocking layer 210 is patterned to define a first region 212 not covered by the first blocking layer 210 and a second region 214 covered by the first blocking layer 210.

Figure 7:
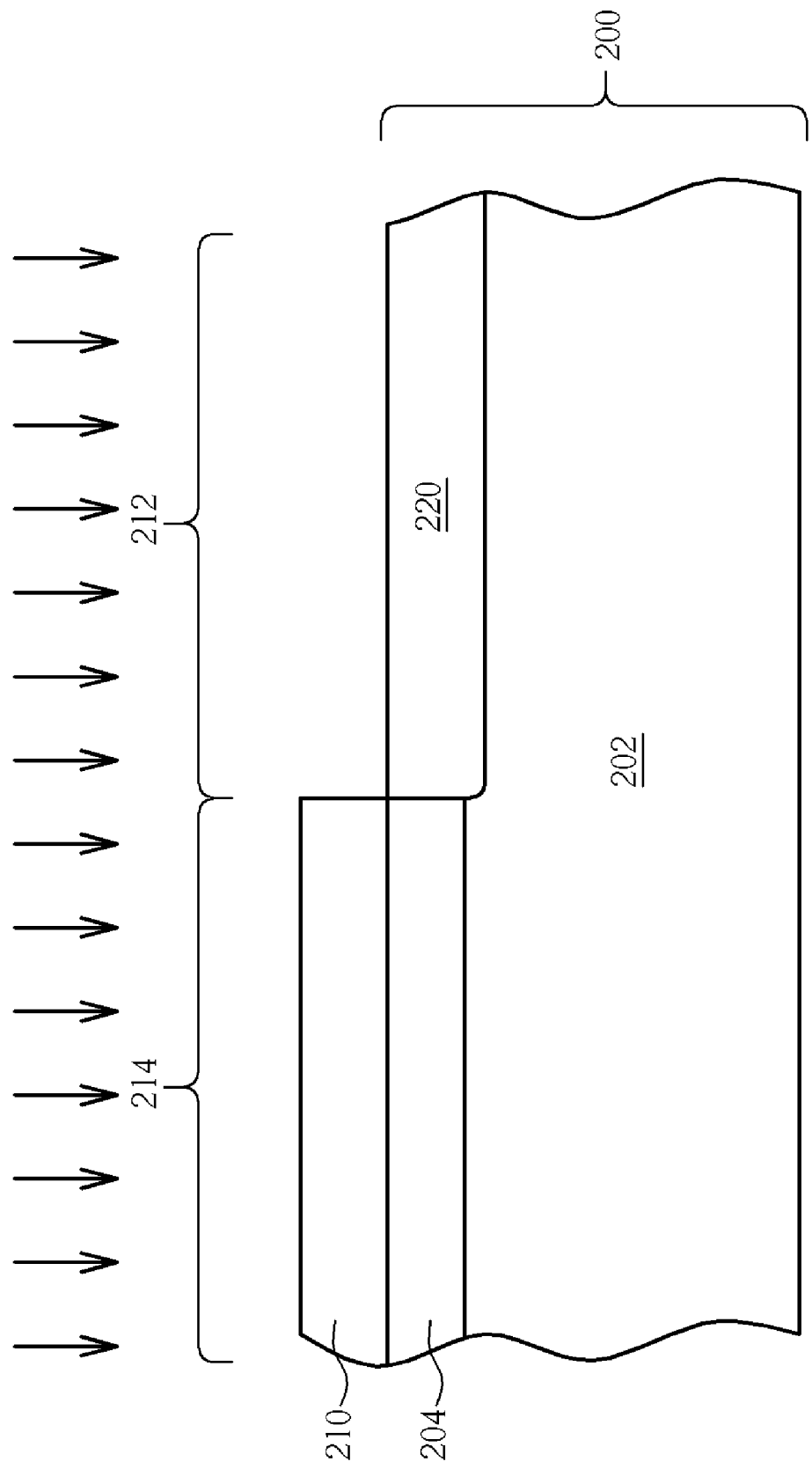

Please refer to FIG. 7. Next, an amorphization process is performed to transform the first region 212 of the second substrate 204 into an amorphized region 220. The amorphization process is performed by implanting dopants comprising Si, Ge, Ar, C, O, N, H, He, Kr, Xe, P, B, As, or a mixture thereof into the first region 212 with the first blocking layer 210 used as an implant mask. Please note that the dopants are implanted to a depth beyond a bonded interface of the first substrate 202 and the second substrate 204.

Figure 8:
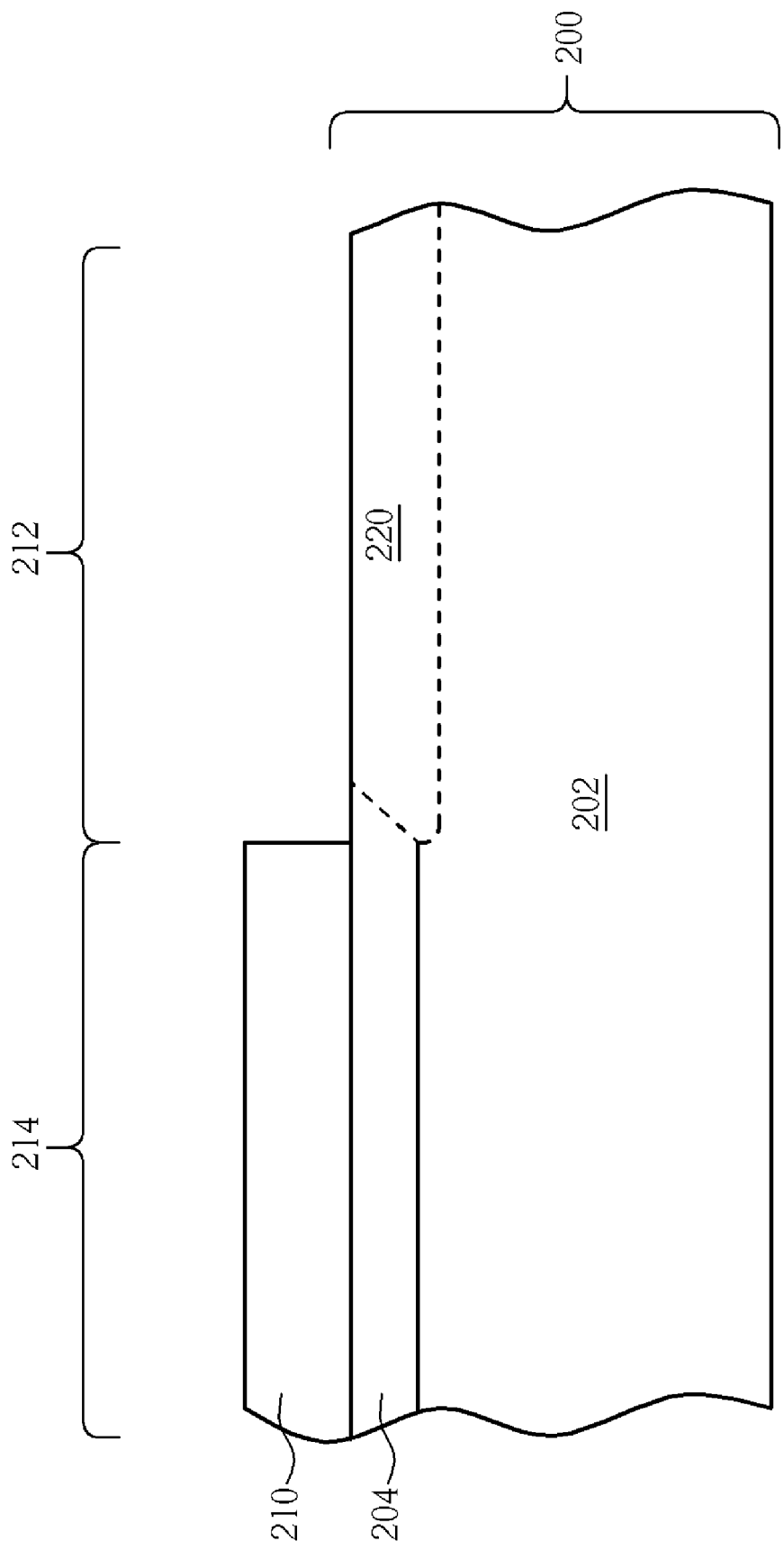

Please refer to FIG. 8. Then, an annealing process is performed to recrystallize the amorphized region 220 into the orientation of the first substrate 202. It is noteworthy the second region 214 is stressed by a compressive stress provided by the first blocking layer 210 in the annealing process. The second region 214 is an active region used to construct a PMOS transistor while the recrystallized first region 212 having the crystalline orientation of the first substrate 202 is an active region on which an NMOS transistor is constructed. Therefore the compressive stress provided by the first blocking layer 210 to the second region 210 further improves a performance of the PMOS transistor.

Figure 9:
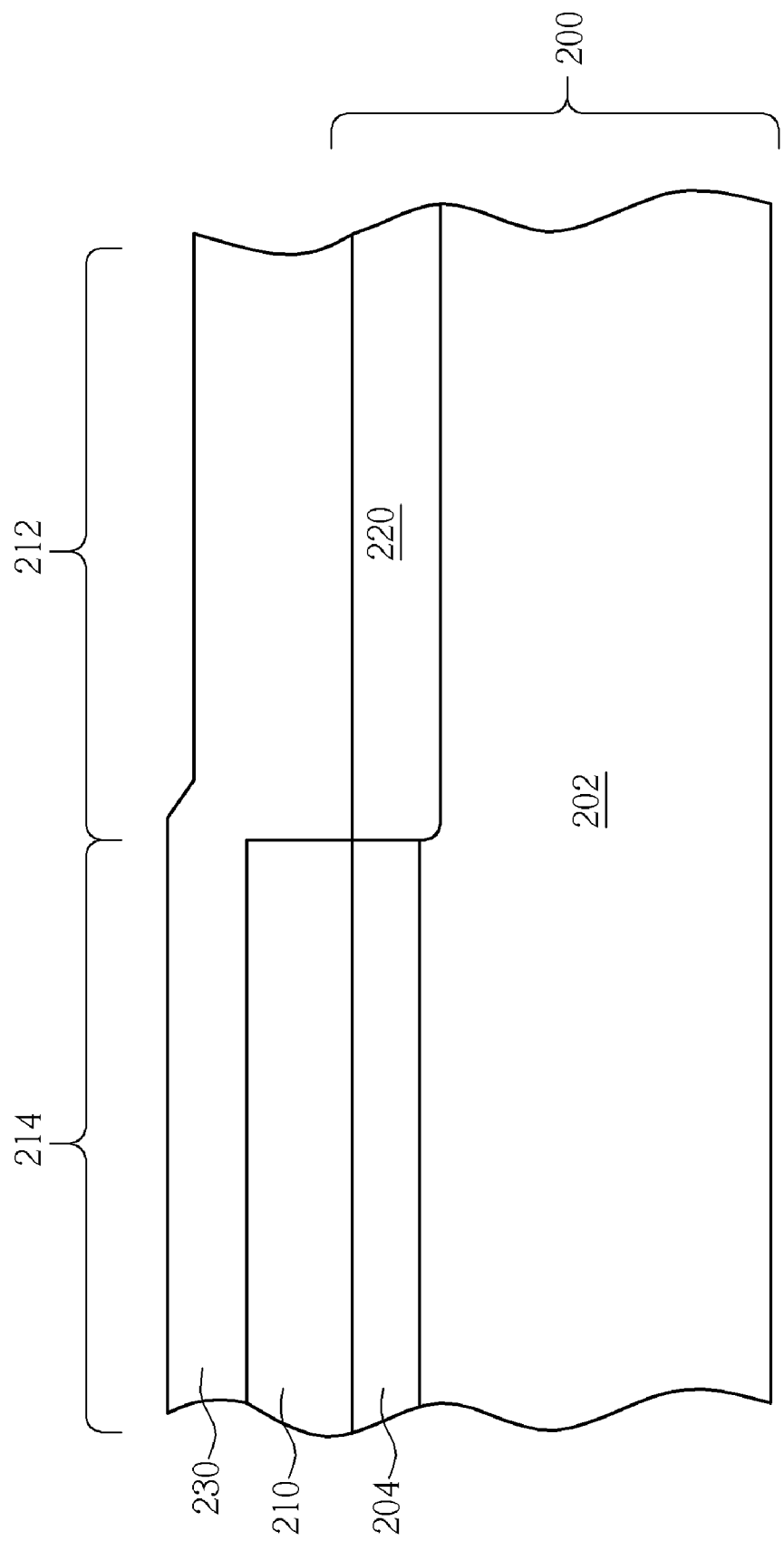
Figure 10:
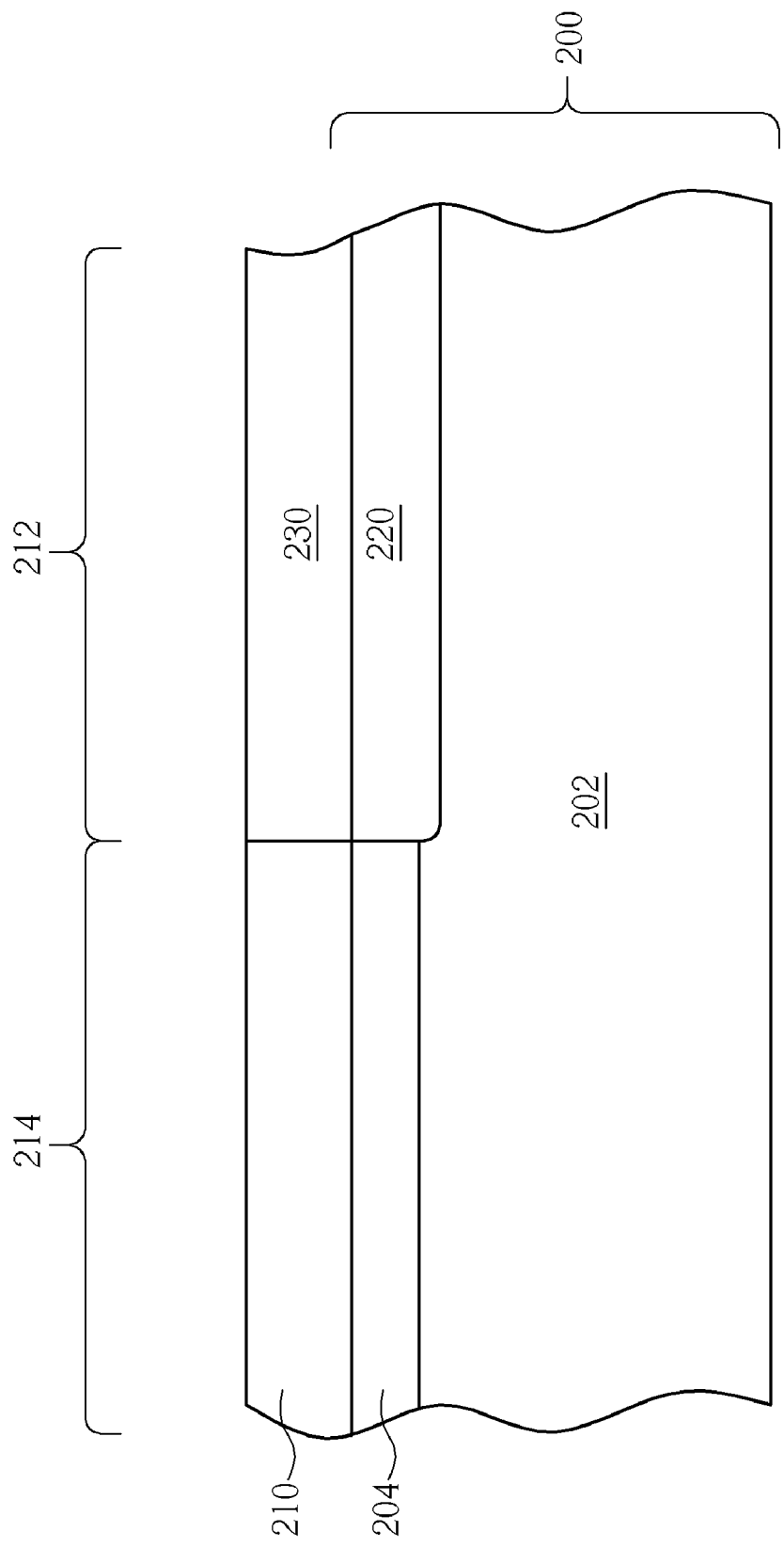

Please refer to FIG. 9. In addition, a second blocking layer or a stress-adjusting layer 230 is formed on the first region 212 and the first blocking layer 210 before performing the annealing process. The second blocking layer 230 can be patterned to expose the first blocking layer 210 as shown in FIG. 10. The second blocking layer 230 provides a tensile stress to the first region 212 and therefore the first region 212 is stressed in the annealing process. As mentioned above, the tensile stress provided by the second blocking layer 230 improves a performance of the NMOS transistor formed on the first region 212 afterwards. Furthermore, lattice of the amorphized region 230 is adjusted by the second blocking layer 230 so that the recrystallization quality in the amorphized region 230 is effectively improved.

According to the provided first preferred embodiment, the hybrid orientation substrate is fabricated with tensile/compressive stress provided by the blocking layers. Therefore the electron mobility of NMOS transistor and the hole mobility of the PMOS transistor are not only improved by being respectively constructed on advantageous crystalline orientations in a wafer while the recrystallization quality of the recrystallized crystalline itself is also improved by the stress, but also improved by the stress provided by the stressed blocking layers as strained-silicon transistors.

Figure 11:
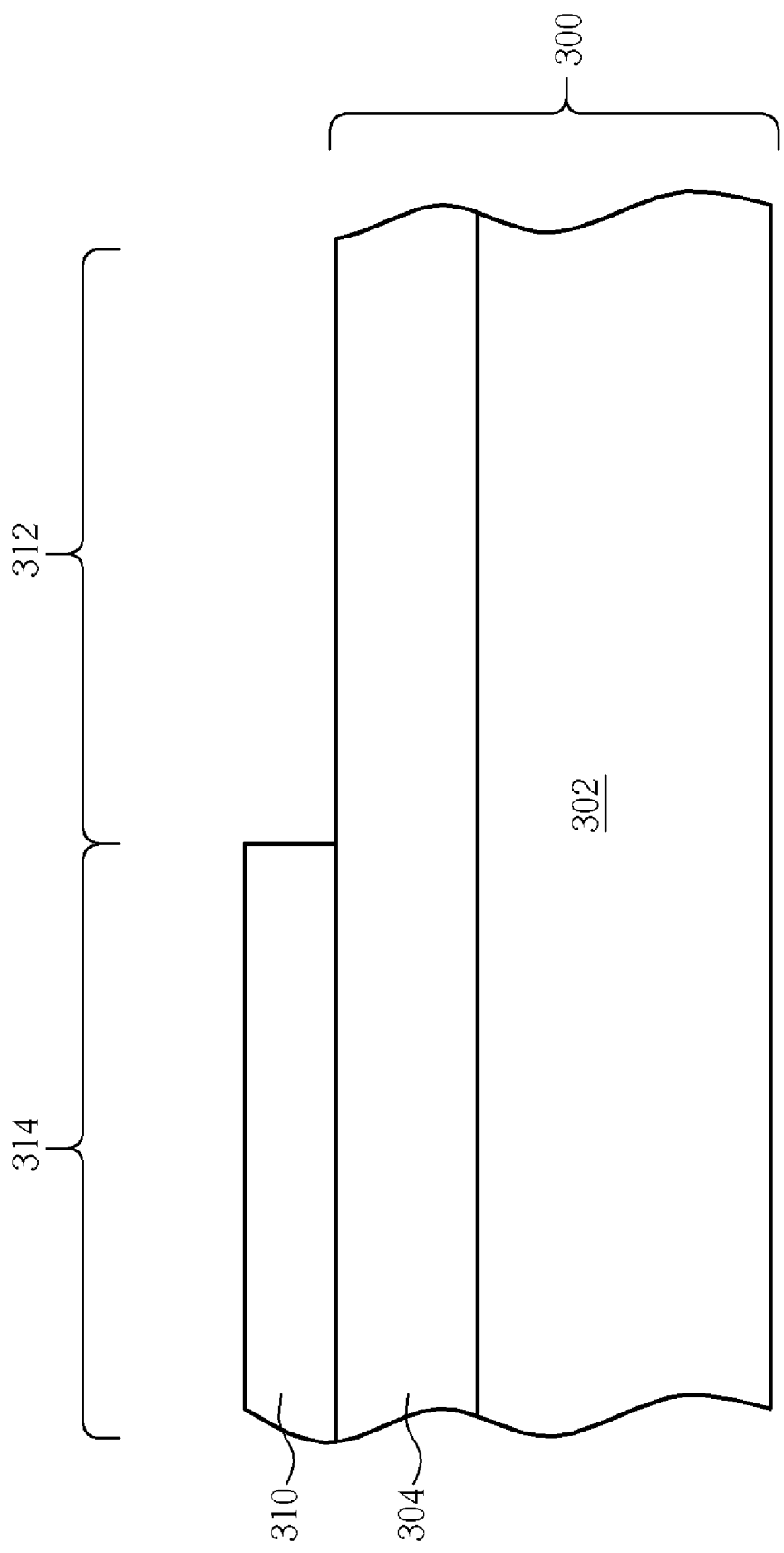
FIGS. 11-16 are schematic drawings illustrating a second preferred embodiment of the method for fabricating a hybrid orientation substrate.

Please refer to FIGS. 11-16, which are schematic drawings illustrating a second preferred embodiment of the method for fabricating a hybrid orientation substrate. As shown in FIG. 11, a DSB wafer 300 having a first substrate 302 with a first crystalline orientation and a second substrate 304 with a second crystalline orientation directly bonded on the first substrate 302 is firstly provided. In the second preferred embodiment, the first crystalline orientation is (100) and the second crystalline orientation is (110). However, it is not limited that the first crystalline orientation can be (110) or other crystalline orientations while the second crystalline orientation is (100) or other crystalline orientations. Then, a first blocking layer 310 comprising silicon oxide, silicon nitride, or silicon oxynitride is formed on the second substrate 304. The first blocking layer 310 is patterned to define a first region 312 not covered by the first blocking layer 310 and a second region 314 covered by the first blocking layer 310.

Figure 12:
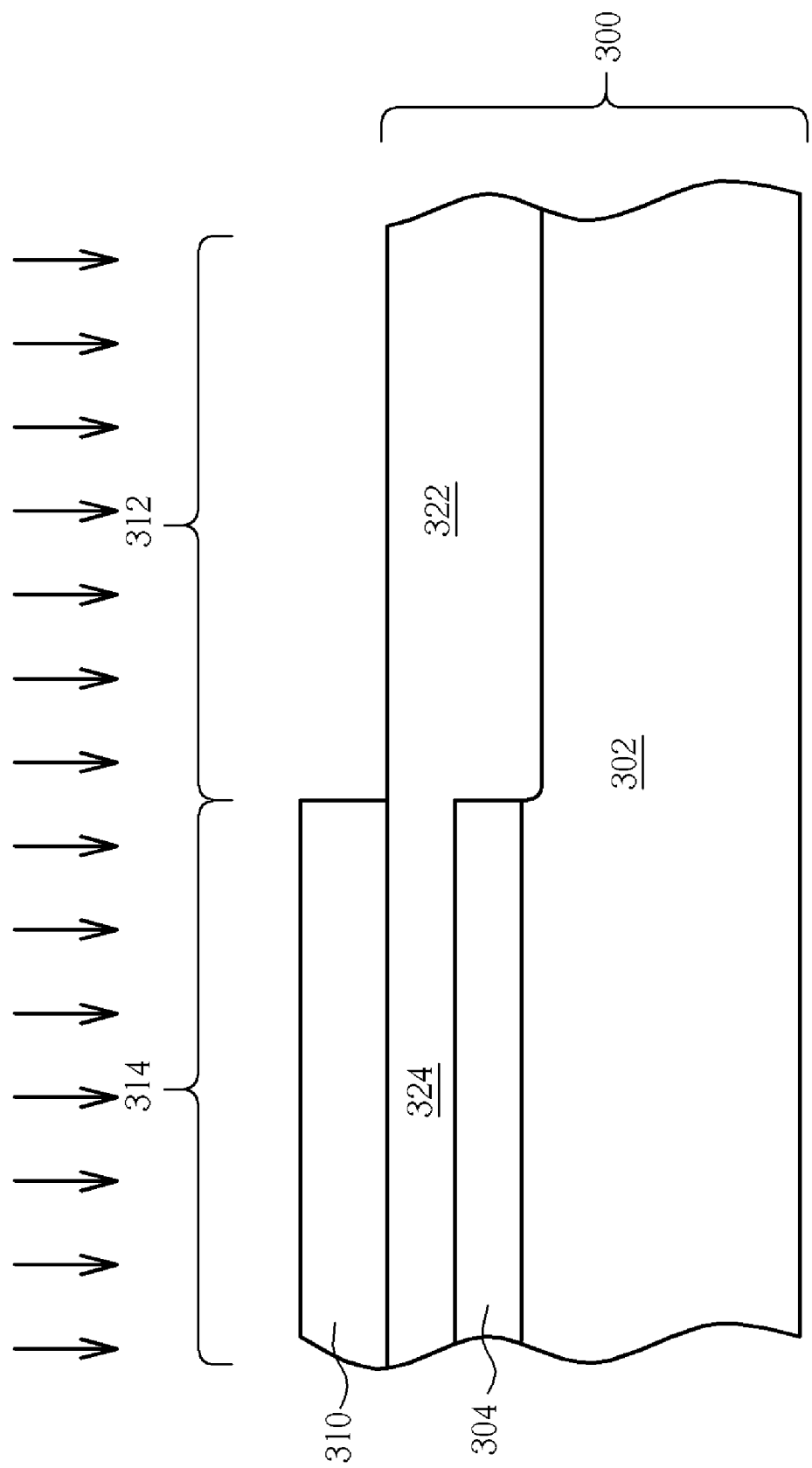

Please refer to FIG. 12, then, an amorphization process is performed by implanting dopants into the first region 312 and the second region 314 with the first blocking layer 310 used as an implant mask. The dopants comprise Si, Ge, Ar, C, O, N, H, He, Kr, Xe, P, B, As, or a mixture thereof. The amorphization process is used to transform the first region 312 and the second region 314 respectively into a first amorphized region 322 and a second amorphized region 324. It is noteworthy that by adjusting factors such as a thickness of the first blocking layer 310 or an implantation energy, the dopants in the first amorphized region 322 are implanted into a depth beyond a bonded interface of the first substrate 302 and the second substrate 304 while the dopants in the second amorphized region 324 are implanted through the first blocking layer 310 into a depth no more than a thickness of the second substrate 304.

Figure 13:
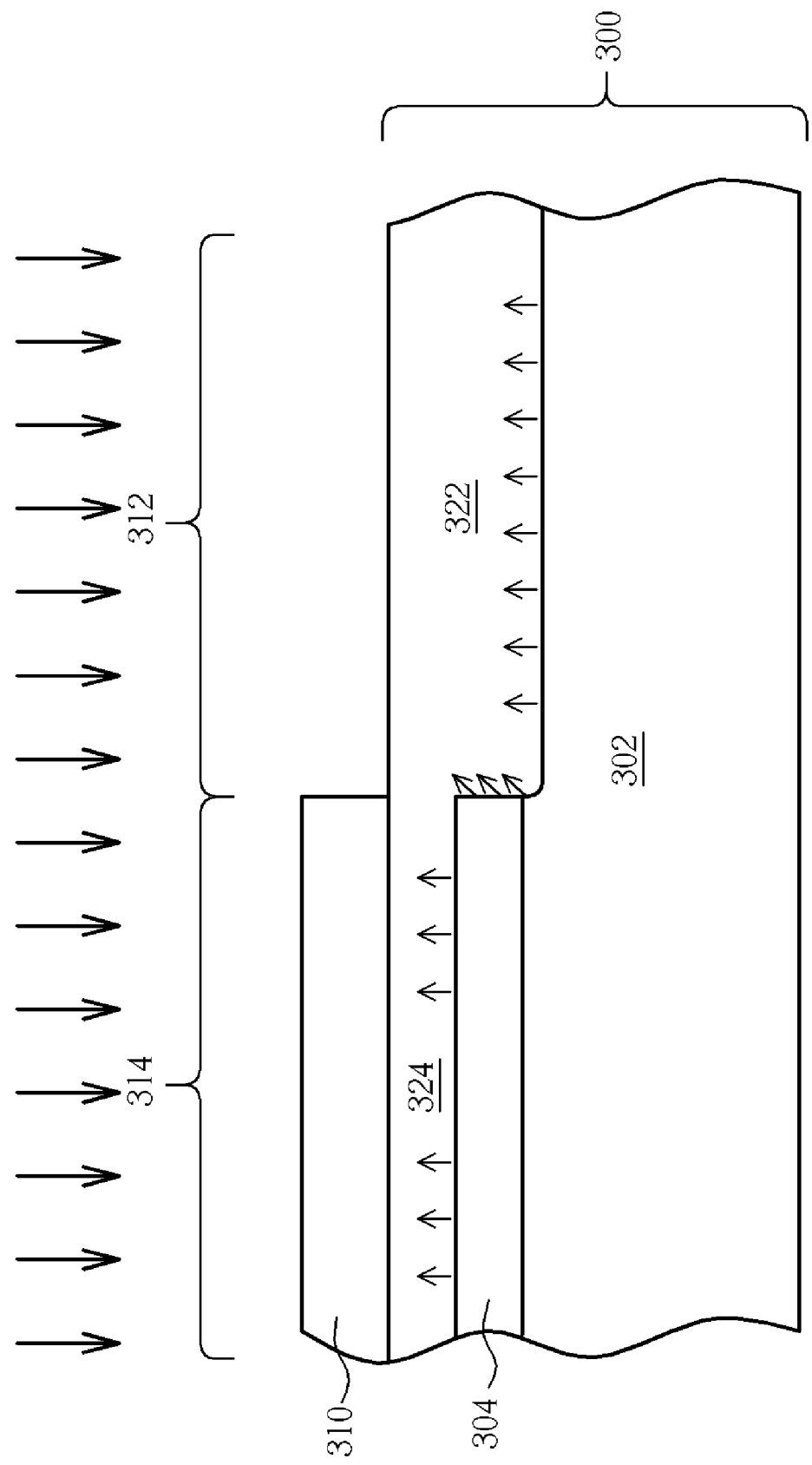
Figure 14:
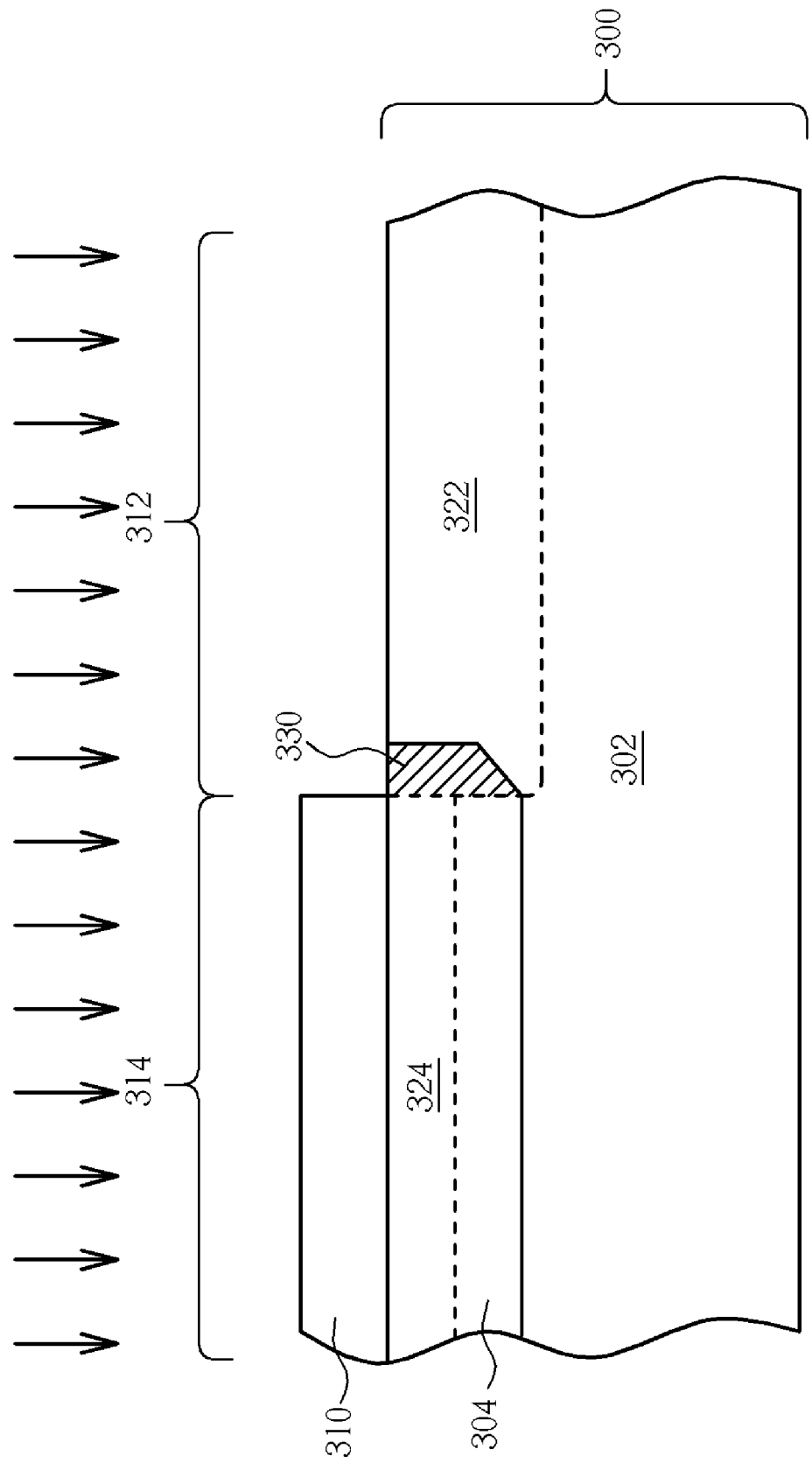

Please refer to FIGS. 13 and 14. Next, an annealing process is performed to recrystallize the first amorphized region 322 and the second amorphized region 324 respectively into the orientations of the first substrate 302 and the second substrate 304. It is noteworthy that the epitaxial silicon in the first amorphized region 322 and the second amorphized region 324 are recrystallized respectively along with surfaces of the first substrate 302 and the second substrate 304 and along with the crystalline orientation of the first substrate 302 and the second substrate 304 as the arrows shown in FIG. 13.

Please refer to FIG. 14. Therefore an interface region 330 between the recrystallized first region 312 and the recrystallized second region 314 is formed as a right trapezoid. Such geometric character makes the interface region 330 between the recrystallized first region 312 and the recrystallized second region 314 smaller and thus a shallow trench isolation formed to replace the interface region 330 can be smaller.

Figure 15:
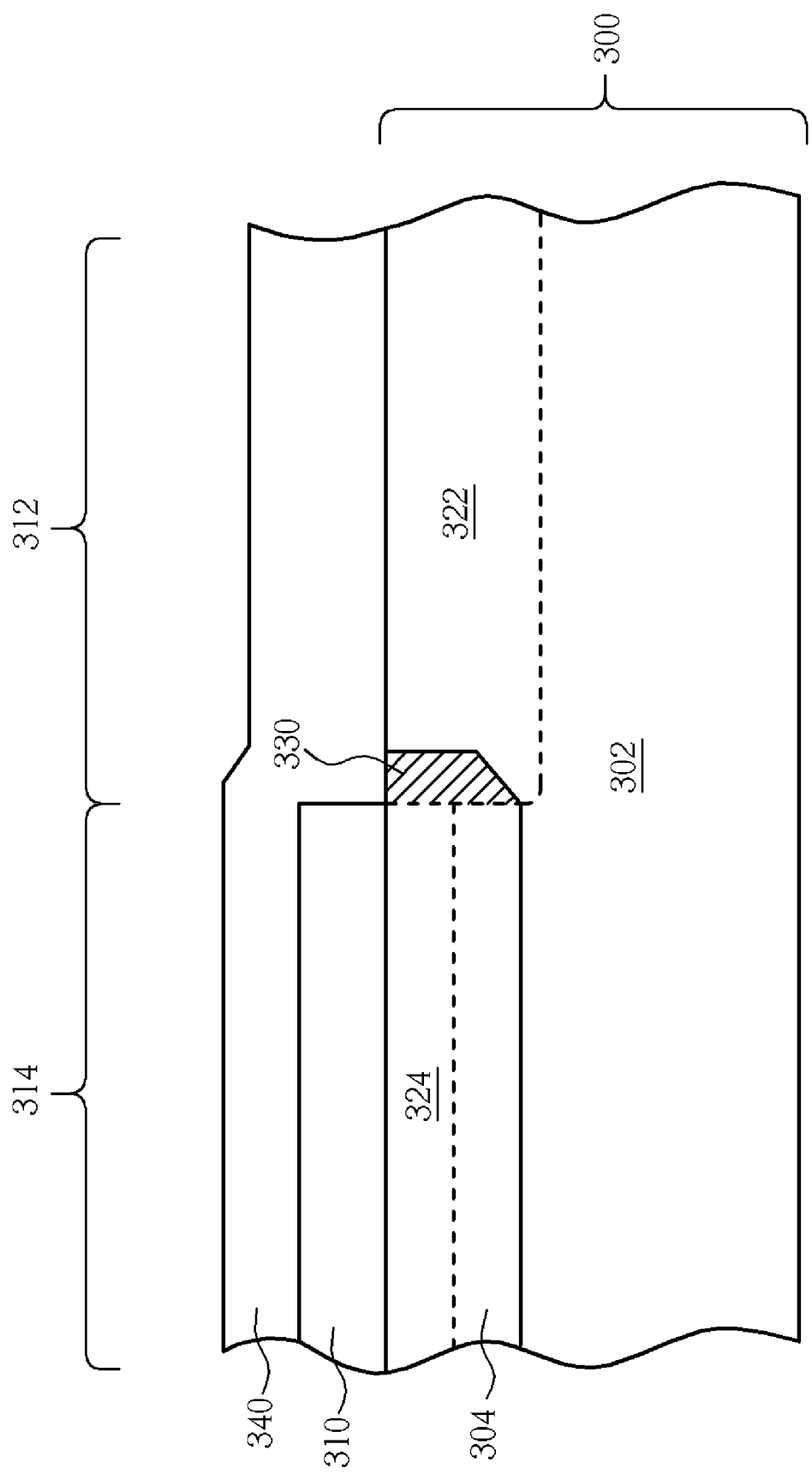
Figure 16:
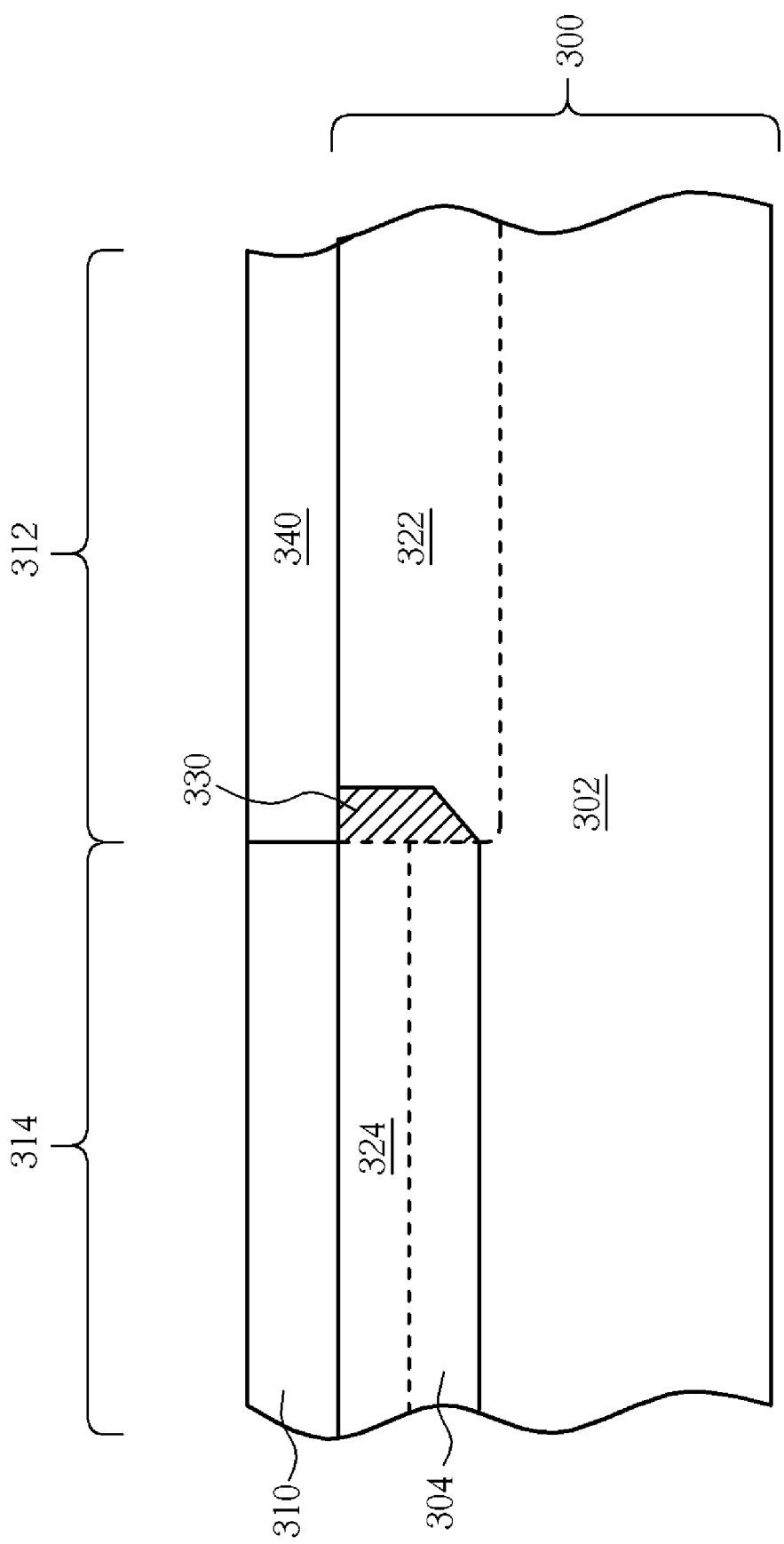

In addition, the second region 314 is stressed by the first blocking layer 310 in the annealing process. Thus a compressive stress is provided to the second region 314 which is an active region used to construct a PMOS transistor afterwards. Furthermore, lattice of the second amorphized region 324 is adjusted by the first blocking layer 310 so that the recrystallization quality in the second amorphized region 324 is effectively improved. Moreover, a second blocking layer or a stress-adjusting layer 340 is formed on the first region 312 and the first blocking layer 310 before performing the annealing process as shown in FIG. 15. In addition, the second blocking layer 340 can be patterned to expose the first blocking layer 310 as shown in FIG. 16. Thus the first region 312, which is an active region used to construct an NMOS transistor afterwards, is stressed by a tensile stress from the second blocking layer 340 in the annealing process. As mentioned above, the compressive stress provided by the first blocking layer 310 to the second region 320 further improves a performance of the PMOS transistor and the tensile stress provided by the second blocking layer 345 improves a performance of the NMOS transistor. Lattice of the first amorphized region 322 is adjusted by the second blocking layer 340 so that the recrystallization quality of the first amorphized region 322 is also effectively improved by the second blocking layer 330.

According to the second preferred embodiment provided by the present invention, the interface region 330 of the hybrid orientation substrate has a shape of right trapezoid and is smaller, therefore the STI formed to replace the interface region 330 is correspondingly smaller. In addition, the hybrid orientation substrate is fabricated with stressed blocking layers. Therefore the electron mobility of NMOS transistor and the hole mobility of the PMOS transistor are not only improved by being respectively constructed on advantageous crystalline orientations in a wafer with smaller STI while the recrystallization quality of the recrystallized crystalline itself is also improved by the stress, but also improved by the stress provided by the stressed blocking layers as strained-silicon transistors.

Figure 17:
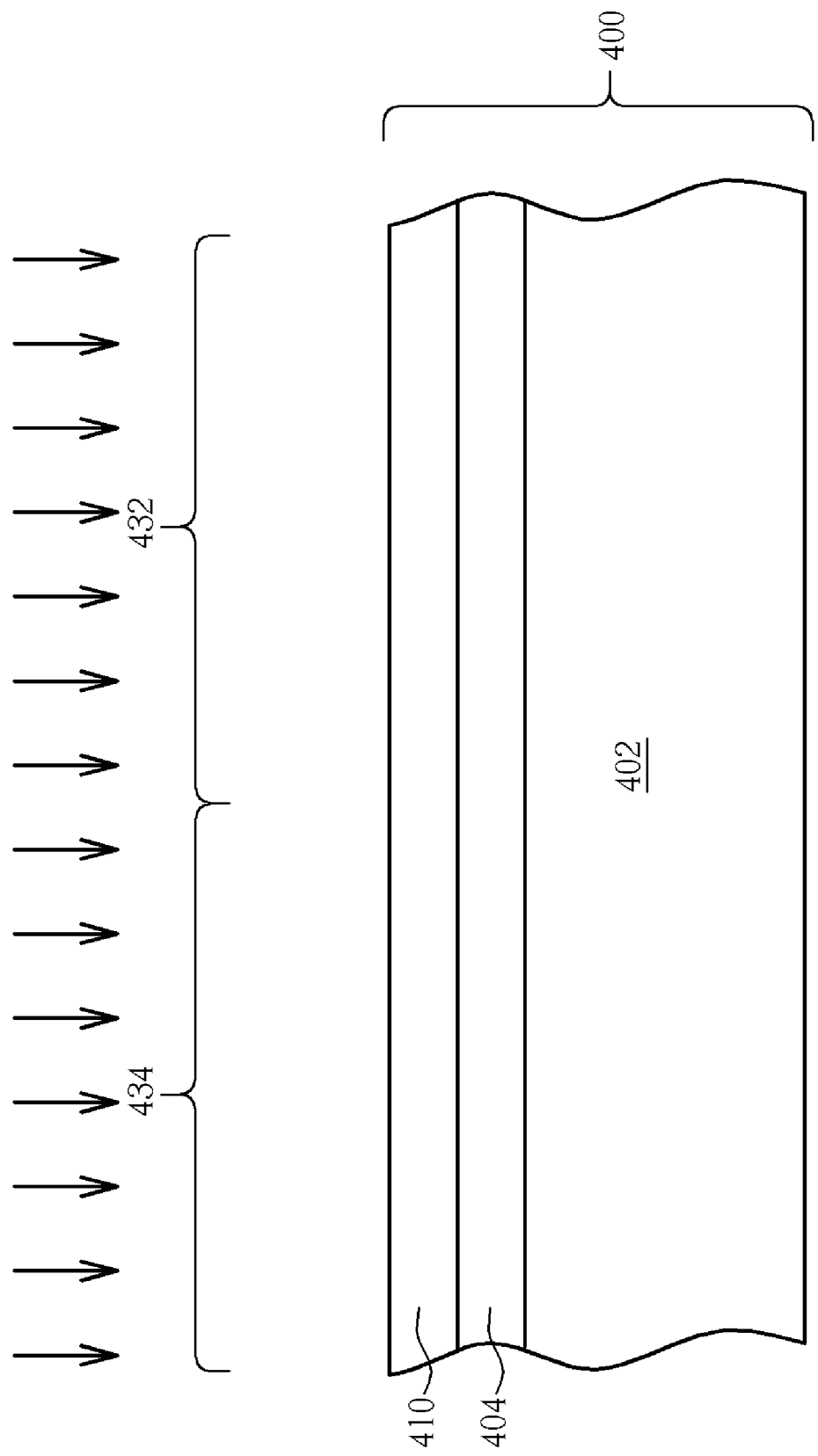
FIGS. 17-21 are schematic drawings illustrating a third preferred embodiment of the method for fabricating a hybrid orientation substrate.

Please refer to FIGS. 17-21, which are schematic drawings illustrating a third preferred embodiment of the method for fabricating a hybrid orientation substrate. As shown in FIG. 17, a DSB wafer 400 having a first substrate 402 with a first crystalline orientation and a second substrate 404 with a second crystalline orientation formed on the first substrate 402 is firstly provided. In the third preferred embodiment, the first crystalline orientation is (100) and the second crystalline orientation is (110). However, it is not limited that the first crystalline orientation can be (110) or other crystalline orientations while the second crystalline orientation is (100) or other crystalline orientations.

Please still refer to FIG. 17. Next, a first amorphization process is performed by implanting dopants into the second substrate 404 and partially transforming the second substrate 404 into a first amorphized region 410. Please note the dopants in the first amorphization process are implanted into a depth no more than a thickness of the second substrate 404. The dopants comprise Si, Ge, Ar, C, O, N, H, He, Kr, Xe, P, B, As, or a mixture thereof.

Figure 18:
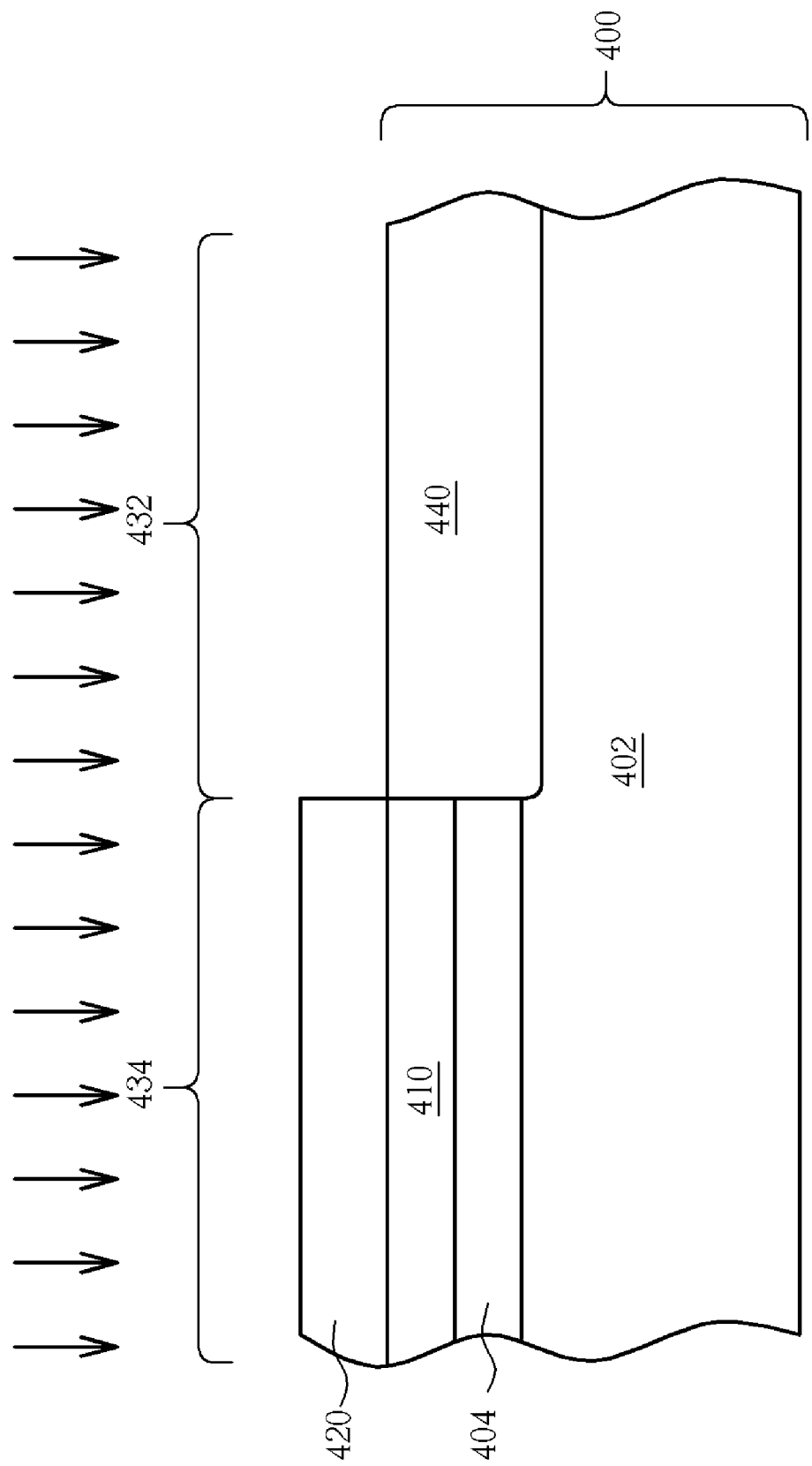

Please refer to FIG. 18. Then, a patterned first blocking layer 420 is formed on the second substrate 404. The patterned first blocking layer 420 defines a first region 432 not covered by the first blocking layer 420 and a second region 434 covered by the first blocking layer 420. Next, a second amorphization process is performed to transform a part of the first amorphized region 410 in the first region 432 into an second amorphized region 440. The second amorphization is performed by implanting the dopants into the first region 432 with the patterned first blocking layer 434 used as an implant mask. It is noteworthy that the dopants in the second amorphization process are implanted into a depth beyond a bonded interface of the first substrate 402 and the second substrate 404.

Figure 19:
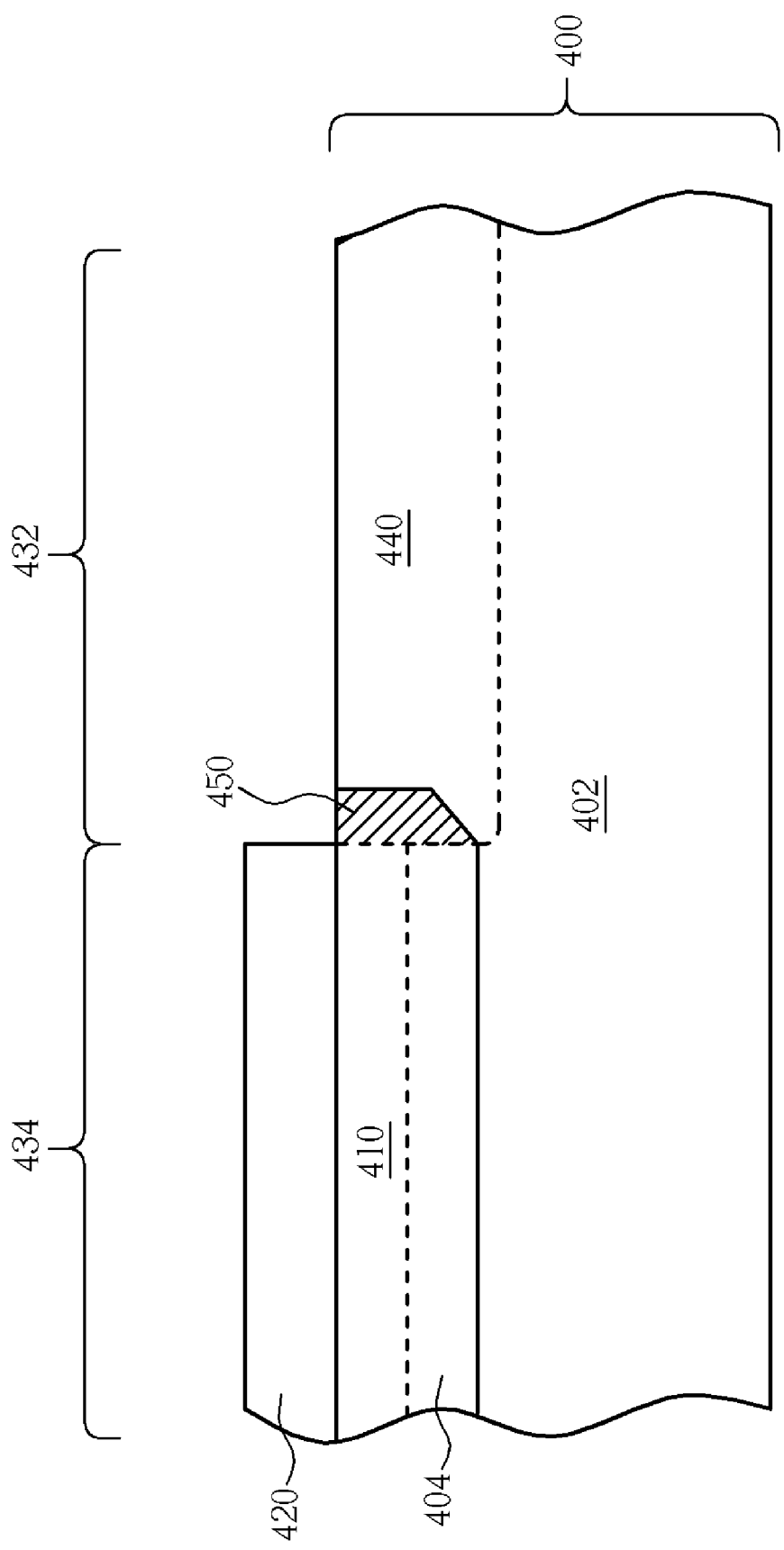

Please refer to FIG. 19. An annealing process is performed to recrystallize the first amorphized region 410 into the orientation of the second substrate 404 and the second amorphized region 440 into the orientation of the first second substrate 402. Please note that, as mentioned before, the epitaxial silicon in the first amorphized region 410 and the second amorphized region 440 are recrystallized respectively along with surfaces of the second substrate 404 and the first substrate 402, and along with the crystalline orientation of the second substrate 404 and the first substrate 402. Therefore an interface region 450 between the recrystallized first region 432 and the recrystallized second region 434 is formed as a right trapezoid. Such geometric character makes the interface region 450 between the recrystallized first region 432 and the recrystallized second region 434 smaller and thus a shallow trench isolation formed to replace the interface region 450 can be smaller.

In addition, the first blocking layer 420 comprises silicon oxide, silicon nitride, or silicon oxynitride or photoresist. On the one hand the first blocking layer 420 made of photoresist will be removed before performing the annealing, and on the other the first blocking layer 420 made of silicon oxide, silicon nitride, or silicon oxynitride will be remained on the DSB wafer 400 during the annealing process. The second region 434 is stressed by a compressive stress from the remained first blocking layer 420 in the annealing process. Furthermore, lattice of the first amorphized region 410 is adjusted by the first blocking layer 420 so that the recrystallization quality in the first amorphized region 410 is effectively improved.

Figure 20:
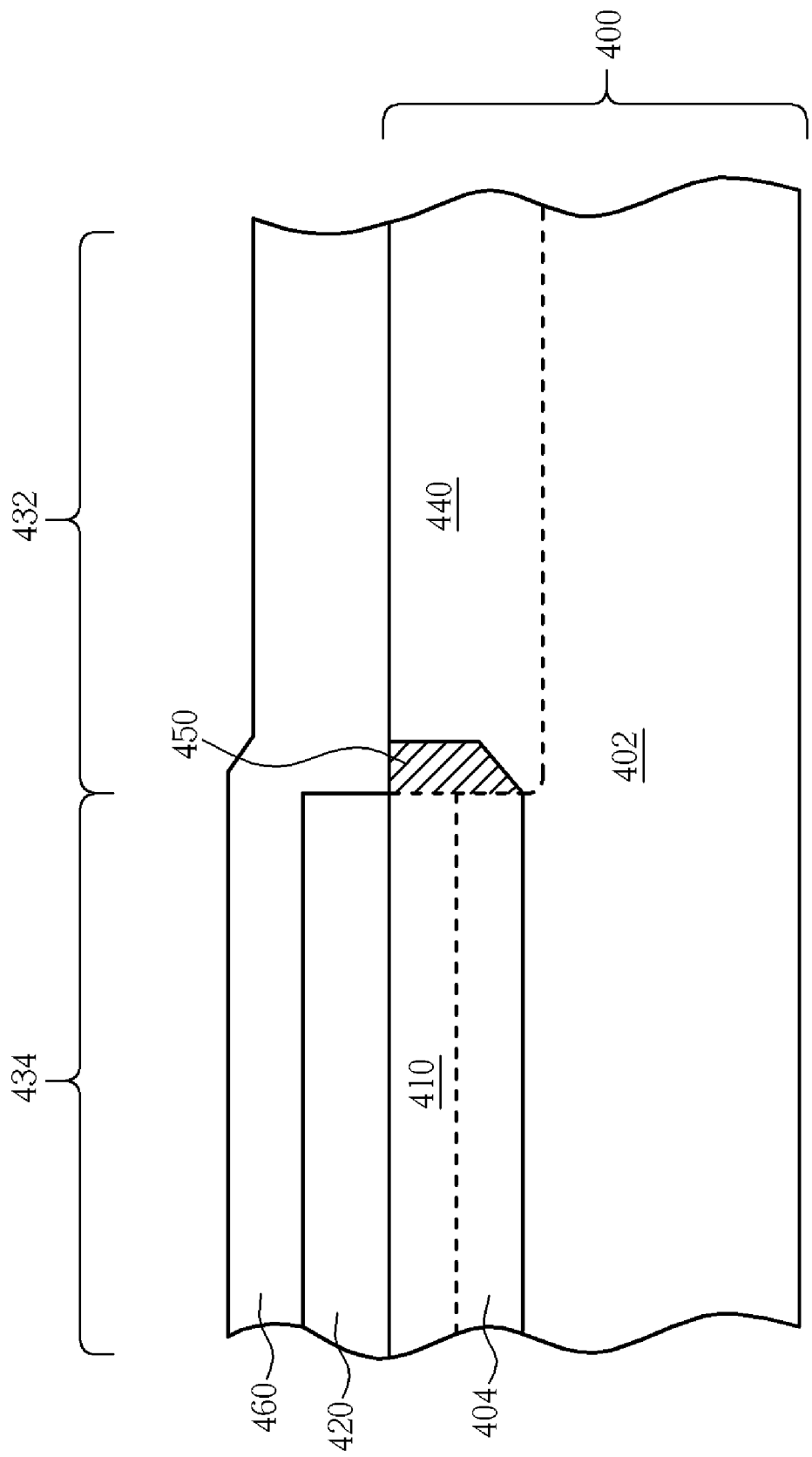
Figure 21:
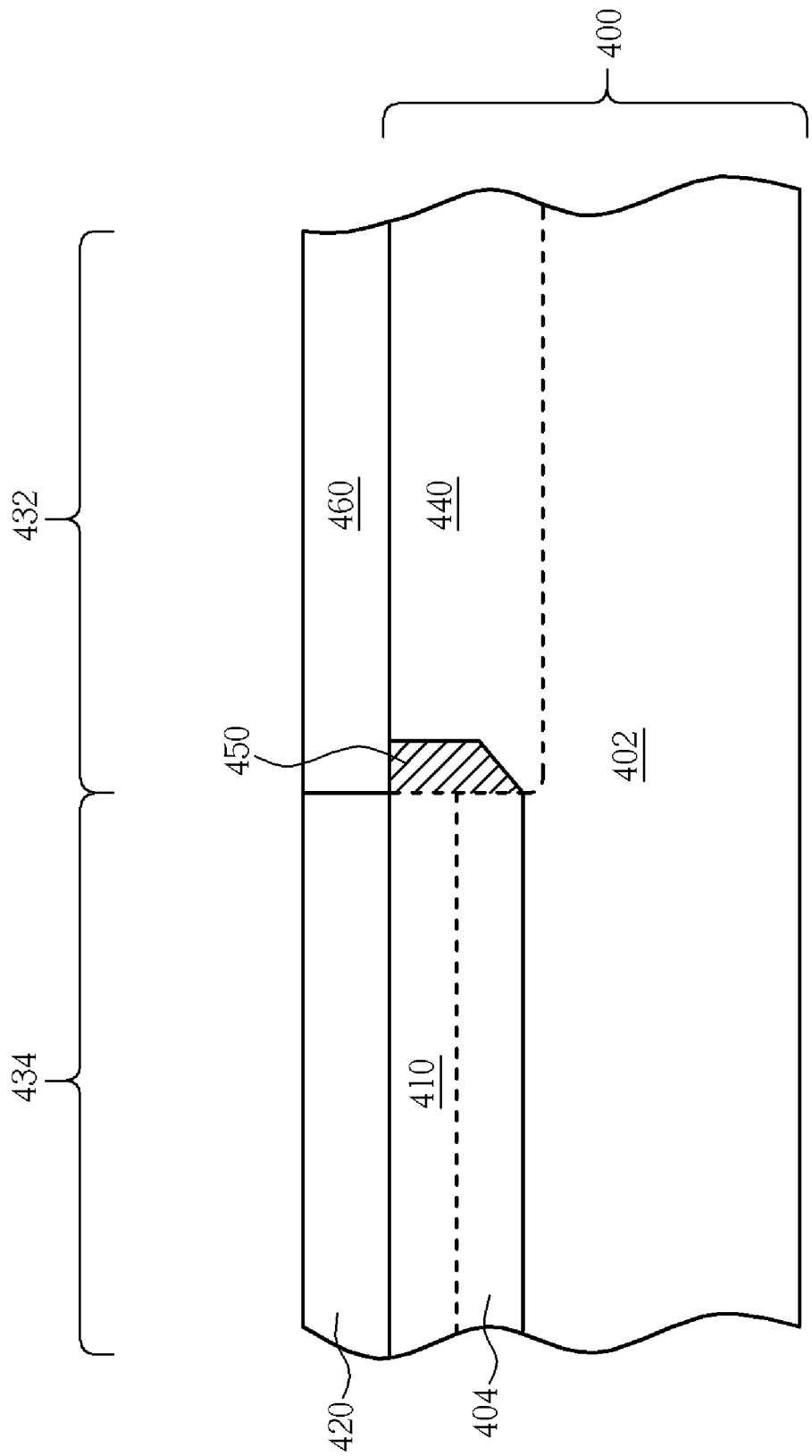

Please refer to FIG. 20. Furthermore, a second blocking layer or a stress-adjusting layer 460 is formed on the first region 432 and the first blocking layer 420 before performing the annealing process. In addition, the second blocking layer 460 can be patterned to expose the first blocking layer 420 as shown in FIG. 21. The first region 432, which is an active region used to construct an NMOS transistor afterwards, is stressed by a tensile stress from the second blocking layer 460 in the annealing process. As mentioned above, the compressive stress provided by the first blocking layer 420 to the second region 434 further improves a performance of the PMOS transistor and the tensile stress provided by the second blocking layer 460 improves a performance of the NMOS transistor. Lattice of the second amorphized region 440 is adjusted by the second blocking layer 460 so that the recrystallization quality in the second amorphized region 440 is also effectively improved.

According to the third preferred embodiment provided by the present invention, the interface region 450 of the hybrid orientation substrate has a shape of right trapezoid and is smaller, therefore the STI formed to replace the interface region 450 is correspondingly smaller. In addition, the hybrid orientation substrate is fabricated with blocking layers. Therefore the electron mobility of NMOS transistor and the hole mobility of the PMOS transistor are not only improved by being respectively constructed on advantageous crystalline orientations in a wafer with smaller STI while the recrystallization quality of the recrystallized crystalline itself is also improved by the stress, but also improved by the stress provided by the stressed blocking layers as strained-silicon transistors.

As mentioned above, although the DSB wafers in the first, second, and third preferred embodiment have a first substrate with a (100) crystalline orientation and a second substrate with a (110) crystalline orientation formed on the first substrate, it is not limited that the DSB wafer must have a first substrate with (110) crystalline orientation and a second substrate with (100) crystalline orientation. In the exemplary FIG. 8, the recrystallized first region 212 is recrystallized along the (110) crystalline orientation of the first substrate 202 to be an active region used to form a PMOS transistor while the second region 214 is recrystallized along the (100) crystalline orientation of the second substrate 204 to be an active region used to form an NMOS transistor. Therefore the first blocking layer 210 provides a tensile stress to the second region 214 in the annealing process and the second blocking layer 230 provides a compressive stress to the first region 212. The same concept can be applied to the second and the third preferred embodiment. Therefore further description of the process is omitted in the interest of brevity in the second and the third embodiments.

Accordingly, the lateral morphology extension in the hybrid orientation substrate is reduced so that the slanted interface region between the first substrate and the second substrate is correspondingly reduced and thus space for forming the STI is economized. Furthermore, the stressed blocking layer in the present invention further improves a speed of the MOS transistors and recrystallization quality.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a hybrid orientation substrate comprising steps of:
   providing a direct silicon bonding (DSB) wafer having a first substrate with a first crystalline orientation and a second substrate with a second crystalline orientation directly bonded thereon;
   forming and patterning a first blocking layer on the second substrate to define a first region not covered by the first blocking layer and a second region covered by the first blocking layer;
   performing an amorphization process to transform the first region of the second substrate into an amorphized region; and
   performing an annealing process to recrystallize the amorphized region into the orientation of the first substrate and simultaneously to make the second region stressed by the first blocking layer.

2. The method of claim 1, wherein the first blocking layer comprises silicon oxide, silicon nitride, or silicon oxynitride.

3. The method of claim 1, wherein the amorphization process is performed by implanting dopants into the first region with the first blocking layer used as an implant mask.

4. The method of claim 3, wherein the dopants comprise Si, Ge, Ar, C, O, N, H, He, Kr, Xe, P, B, As, or a mixture thereof.

5. The method of claim 3, wherein the dopants are implanted to a depth beyond a bonded interface of the first substrate and the second substrate.

6. The method of claim 1 further comprising a step of forming a second blocking layer on the first region and the first blocking layer before performing the annealing process.

7. The method of claim 6, wherein the second blocking layer is patterned to expose the first blocking layer.

8. The method of claim 6, wherein the first region is stressed by the second blocking layer.

9. The method of claim 1, wherein the first crystalline orientation is (100) crystalline orientation and the second crystalline orientation is (110) crystalline orientation.

10. The method of claim 1, wherein the first crystalline orientation is (110) crystalline orientation and the second crystalline orientation is (100) crystalline orientation.

* * * * *

UNITED STATES PATENT AND TRADEMARK OFFICE
CERTIFICATE OF CORRECTION

PATENT NO. : 7,608,522 B2
APPLICATION NO. : 11/684634
DATED : October 27, 2009
INVENTOR(S) : Chien-Ting Lin et al.

It is certified that error appears in the above-identified patent and that said Letters Patent is hereby corrected as shown below:

On the title page, item (75), correct the residence of the third inventor from "Kaoshiung County (TW)" to "Kaohsiung County (TW)".

Signed and Sealed this

Twenty-second Day of December, 2009

David J. Kappos
*Director of the United States Patent and Trademark Office*